(12) United States Patent
O'Dowd et al.

(10) Patent No.: US 7,353,711 B2
(45) Date of Patent: Apr. 8, 2008

(54) CAPACITIVE SENSOR

(75) Inventors: John O'Dowd, Crecora (IE); Damien Joseph McCartney, Raheen (IE); William Hunt, Castetroy (IE); Eamon Hynes, Raheen (IE); John M. Wynne, Lisnalty (IE); Patrick Crowley, Mungret (IE); John R. Martin, Foxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 10/914,909

(22) Filed: Aug. 10, 2004

(65) Prior Publication Data

US 2005/0229710 A1 Oct. 20, 2005

Related U.S. Application Data

(60) Provisional application No. 60/494,147, filed on Aug. 11, 2003.

(51) Int. Cl.
*G01L 9/12* (2006.01)
(52) U.S. Cl. .............. 73/718; 73/724; 73/753
(58) Field of Classification Search ........... 73/700–756
See application file for complete search history.

(56) References Cited

U.S. PATENT DOCUMENTS

| | | | | |
|---|---|---|---|---|
| 5,150,275 A | * | 9/1992 | Lee et al. ................ 361/283.4 |
| 5,164,328 A | * | 11/1992 | Dunn et al. ................ 438/51 |
| 5,241,864 A | * | 9/1993 | Addie et al. ................ 73/718 |
| 5,407,730 A | * | 4/1995 | Imanaka .................... 428/209 |
| 5,436,795 A | | 7/1995 | Bishop et al. ........... 361/283.4 |
| 5,561,247 A | * | 10/1996 | Mutoh et al. ................ 73/724 |
| 5,571,970 A | * | 11/1996 | Mutoh et al. ................ 73/724 |
| 5,663,496 A | * | 9/1997 | Handfield et al. ......... 73/146.5 |
| 6,278,379 B1 | | 8/2001 | Allen et al. ............ 340/870.16 |
| 6,431,005 B1 | * | 8/2002 | Delaye ........................ 73/724 |
| 6,465,271 B1 | * | 10/2002 | Ko et al. ....................... 438/48 |
| 6,520,014 B1 | * | 2/2003 | Brandl ......................... 73/493 |
| 6,550,337 B1 | * | 4/2003 | Wagner et al. ................ 73/715 |
| 2005/0030724 A1 | * | 2/2005 | Ryhanen et al. ............ 361/760 |

FOREIGN PATENT DOCUMENTS

JP 2002039893 A 2/2002

\* cited by examiner

*Primary Examiner*—Anore J. Allen
*Assistant Examiner*—Jermaine Jenkins
(74) *Attorney, Agent, or Firm*—Iandiorio Teska & Coleman

(57) ABSTRACT

A capacitive sensor including a housing having a hermetically sealed cavity, a plate in the cavity, a diaphragm forming a part of the cavity and spaced from the plate, a conductive layer on the first diaphragm, and a second conductive layer on the plate, the first and second conductive layers being the electrodes of a capacitor whose capacitance varies with the position of the diaphragm relative to the plate.

88 Claims, 13 Drawing Sheets

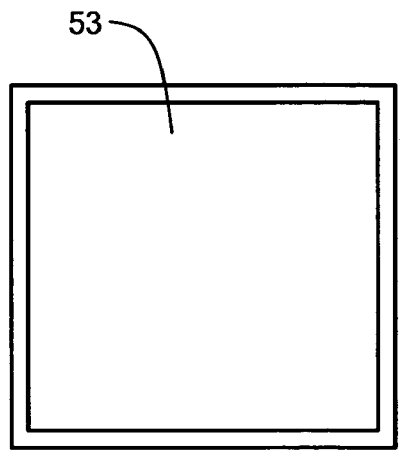
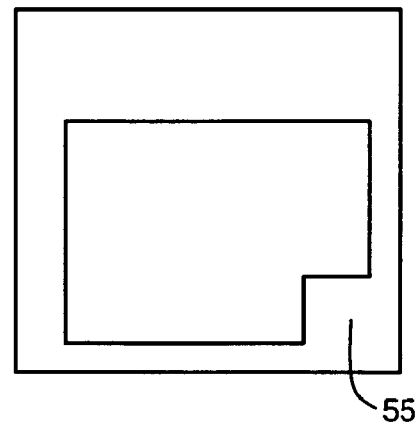
*FIG. 3A*  *FIG. 3B*
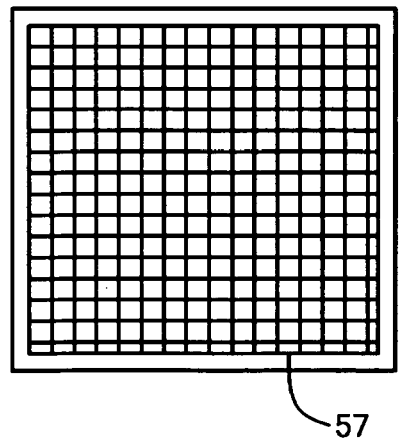
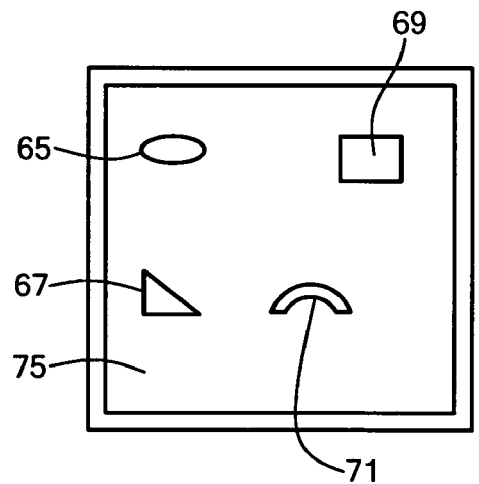
*FIG. 3C*  *FIG. 3D*

CAPACITIVE SENSOR

RELATED APPLICATIONS

This application claims benefit of U.S. Provisional Application No. 60/494,147, filed Aug. 11, 2003, entitled "Low Cost Pressure Sensor" incorporated by reference herein.

FIELD OF THE INVENTION

This invention relates generally to a capacitive sensor and more particularly to an improved capacitive sensor for measuring pressure.

BACKGROUND OF THE INVENTION

Pressure sensors for use in applications such as tire pressure monitoring systems and the like need to be inexpensive, resistant to hostile environments, and consume very little power. This is especially important in battery powered systems because the sensor and related electronic circuits may operate for an extended period of time on a single coin sized battery.

By comparison, conventional pressure sensors which utilize piezo-resistive elements to measure changes in resistance to determine pressure are less power efficient which limits battery life. To overcome the problems associated with piezo-resistive elements, conventional capacitive type pressure sensors measure capacitance to determine pressure. One example of a capacitive pressure sensor utilizes MEMS technology wherein a diaphragm, capacitive electrodes, and a cavity are machined onto silicon. The capacitive sensor also includes electronic circuitry which measures the capacitance of the capacitive electrodes. To protect the diaphragm, the capacitive electrodes and the electronic circuitry from contamination in a hostile environment a cover is disposed over the cavity in the sensor package. However, because the diaphragm must be exposed to the pressure being measured, the cover must include one or more openings to allow exposure to the pressure being measured. The openings allow unwanted contaminants to enter the cavity which affects the capacitance being measured which leads to inaccurate measurements and can destroy the sensor.

Other prior art capacitive type pressure sensors, such as U.S. Pat. No. 5,436,795, incorporated by reference herein, overcome the problems associated with a cover having openings therein by employing a hermetically sealed cavity with two capacitive electrode plates sealed within the cavity to form a capacitive pressure measuring device. The design of the '795 patent incorporates a diaphragm into the cavity enclosure which deflects in response to the difference between the external pressure and the internal cavity pressure. One of the electrodes is located on the diaphragm and hence the capacitance is dependent on the pressure differential. However, the sensor as disclosed in the '795 patent has a limited spacing between the capacitive plates on the order of about 0.5 to 2.5 mils, and hence cannot accommodate any signal processing circuitry (e.g., an integrated circuit die). Hence, the design of the sensor as disclosed in the '795 patent requires any signal processing circuitry to be housed in a separate package which increases the size and complexity of the sensor.

Another prior art capacitive type pressure sensor is disclosed in U.S. Pat. No. 6,278,379, incorporated herein by reference. The sensor device as disclosed in the '379 patent includes a hermetic cavity with two capacitive electrodes disposed on the diaphragms on opposing sides of the cavity enclosure. The design provides for increased deflection of the capacitive electrodes which improves sensitivity. However, the '379 patent discloses that the gap must similarly be minimized to maximize the sensitivity of the sensor. In principle the cavity and gap could be enlarged to accommodate signal processing circuitry, e.g., an integrated circuit die; however, such a change would limit the minimum gap to greater than the die thickness (typically 600 um), and would also limit the area overlap between the capacitive electrodes, both of which would significantly reduce the sensitivity of the sensor to the applied pressure.

Other capacitive-based pressure sensors, such as Japanese Patent Application No. 2002039893, incorporated by reference herein, can provide a pressure sensor and a housing for electronic circuitry. This is achieved by employing a first cavity to accommodate electronic circuitry within the package and a second cavity, hermetically sealed, having two capacitive electrode plates sealed within the second cavity to form a capacitive type pressure measuring device. However, the design is complex, difficult to manufacture and expensive.

BRIEF SUMMARY OF THE INVENTION

It is therefore an object of this invention to provide an improved capacitive sensor.

It is a further object of this invention to provide such a capacitive sensor which is simple in design.

It is a further object of this invention to provide such a capacitive sensor which is inexpensive to manufacture.

It is a further object of this invention to provide such a capacitive sensor which utilizes less power than piezoresistive sensors.

It is a further object of this invention to provide such a capacitive sensor which effectively protects the capacitive electrodes and the electronic circuitry from a hostile environment.

It is a further object of this invention to provide such a capacitive sensor which eliminates the need for separate cavities for the capacitive electrodes and the electronic circuitry.

The invention results from the realization that a truly effective and robust integrated capacitive sensor can be achieved by providing a housing having a hermetically sealed cavity, disposing a plate in the cavity, and providing a diaphragm which forms part of the cavity and is spaced from the plate wherein the diaphragm includes a first conductive layer and the plate includes a second conductive layer together which form the electrodes of a capacitor whose capacitance varies with the position of the diaphragm relative to the plate.

This invention features a capacitive sensor including a housing having a hermetically sealed cavity, a first plate in the cavity, a first diaphragm forming a part of the cavity and spaced from the first plate, a first conductive layer on the first diaphragm, and a second conductive layer on the first plate, the first and second conductive layers being the electrodes of a capacitor whose capacitance varies with the position of the first diaphragm relative to the first plate.

In one embodiment, the first diaphragm may be disposed proximate a top surface of the housing. The first diaphragm may be disposed proximate a bottom surface of the housing. The first diaphragm may be disposed proximate a side surface of the housing. The second conductive layer may be disposed proximate a top surface of the first plate. The second conductive layer may be disposed proximate a bottom surface of the first plate. The second conductive layer may be disposed proximate a side surface of the first plate. The housing may include a material chosen from the group consisting of ceramic, plastic, metal or any combination thereof. The first plate may include an integrated circuit die. The first plate may include a printed circuit board. The first conductive layer may be embedded in the first diaphragm. The second conductive layer may be embedded in the first plate. The first conductive layer may be disposed on the outer surface of the first diaphragm. The first conductive layer may be disposed on the inner surface of the first diaphragm. The first conductive layer may be disposed on a portion of the first diaphragm. The second conductive layer may be disposed on a portion of the first plate. The housing may include a separately attached lid. The diaphragm may be a separately attached lid. The diaphragm may include a material chosen from the group consisting of ceramic, plastic, metal or any combination thereof. The diaphragm may be comprised of a material different than the housing. The lid may be attached to the housing by soldering the lid to a metal layer fused into the housing. The lid may be attached to the housing by welding the lid to a metal layer fused into the housing. The lid may be attached to the housing with an adhesive material. The lid may be attached to the housing with glass. The first conductive layer may include a mesh of the conductive material for forming the electrode. The first conductive layer may include a solid layer of conductive material for forming the electrode. The first conductive layer may include a solid layer of conductive material with spaced orifices therein. The second conductive layer may include a mesh of conductive material for forming the electrode. The second conductive layer may include a solid layer of conductive material for forming the electrode. The second conductive layer may include a solid layer of conductive material with spaced orifices therein. The first plate may include a material chosen from the group consisting of silicon, ceramic, glass, quartz, plastic, epoxy resin, and metal. The first plate may include an electrical sub-system. The electrical sub-system may convert the capacitance to one or more electrical signals. The electrical sub-system may measure the capacitance. The electrical sub-system may include a transmitter for transmitting the one or more signals representative of the capacitance. The capacitive sensor may further include an antenna responsive to the one or more signals. The capacitive sensor may further include a receiver for receiving initiation signals. The electrical sub-system may measure the temperature proximate the sub-system. The electrical sub-system may transmit one or more signals representative of the temperature. The electrical sub-system may manage the power consumption of the electrical sub-system. The electrical sub-system may include an interrogation device for allowing the sub-system to be externally interrogated. The electrical sub-system may receive external commands to manage the power consumption of the sub-system. The capacitive sensor may further include an inductor combined with the capacitor formed by the first and second conductive layers to form a resonant circuit. The first plate may include one or more sensors. The one or more sensors may be chosen from the group consisting of: an acceleration sensor, a temperature sensor and a motion sensor. The first plate may further include a transmission device for transmission of one or more output signals of the one or more sensors. The capacitive sensor may further include first electrical interconnections disposed in the housing. The capacitive sensor may further include second electrical interconnections for connecting the second conductive layer on the first plate to the first electrical interconnections. The capacitive sensor may further include third electrical interconnections for connecting the first conductive layer on the diaphragm to the first electrical interconnections. The capacitance may represent pressure. The capacitance may represent the difference in pressure between the cavity and the exterior of the housing. The capacitive sensor may further include a proof mass disposed on the diaphragm for varying the position of the diaphragm relative to the plate in response to acceleration. The second conductive layer may include a conductive spacer for reducing the gap distance between the first conductive layer and the second conductive layer. The capacitance may vary with the position of the diaphragm relative to the plate in response to an external force. The capacitive sensor may further include a second plate in the cavity. The second plate may include an electrical sub-system. The electrical sub-system may convert the capacitance to one or more electrical signals. The electrical sub-system may measure the capacitance. The electrical sub-system may include a transmitter for transmitting the one or more signals representative of the capacitance. The capacitive sensor may further include an antenna responsive to the one or more signals. The capacitive sensor may further include a receiver for receiving initiation signals. The electrical sub-system may measure the temperature proximate the sub-system. The electrical sub-system may transmit one or more signals representative of the temperature. The electrical sub-system may manage the power consumption of the electrical sub-system. The electrical sub-system may include an interrogation device for allowing the sub-system to be externally interrogated. The electrical sub-system may receive external commands to manage the power consumption of the system. The second plate may include one or more sensors. The one or more sensors may be chosen from the group consisting of: an acceleration sensor, a temperature sensor and a motion sensor. The first plate and/or the second plate may include a transmission device for transmission of one or more output signals of the one or more sensors. The second plate may be disposed on a top surface of the first plate. The second plate may be laterally spaced from the first plate. The capacitive sensor may further include a second diaphragm forming a part of the cavity spaced from the first plate. The capacitive sensor may further include a third conductive layer on the second diaphragm. The capacitive sensor may further include a fourth conductive layer on the first plate, the third and fourth conductive layers being the electrodes of a second capacitor whose capacitance varies with the position of the second diaphragm relative to the first plate. The capacitive sensor may further include a second plate having a fourth conductive layer and a second diaphragm having a third conductive layer forming part of the cavity spaced from the second plate. The fourth conductive layer on the second plate and the third conductive layer on the second diaphragm may form a second capacitor whose capacitance varies with the position of the second diaphragm relative to the second plate. The first diaphragm may be proximate on a top surface of the housing and the second diaphragm may be proximate a bottom surface of the housing. The first and second diaphragms may be laterally spaced on the housing. The first diaphragm and the first plate may be proximate a top surface of the housing and the second diaphragm and the second plate may be proximate a bottom surface of the housing. The first plate and the first diaphragm and the second plate and the second diaphragm may be laterally spaced in the housing. Each of the first and second diaphragms may be subjected to a different pressure such that the capacitance of the first capacitor represents a difference in pressure between the cavity and the pressure applied to the first diaphragm and the capacitance of the second capacitor represents a difference in pressure between the cavity and the pressure applied to the second diaphragm. Each of the diaphragms may be subjected to a different pressure such that the capacitance of the first capacitor represents a difference in pressure between the cavity and the pressure applied to the first diaphragm and the capacitance of the second capacitor represents a difference in pressure between the cavity and the pressure applied to the second diaphragm. The capacitance of the first capacitor and the capacitance of the second capacitor may be subtracted to determine a differential pressure. The capacitance of the first capacitor and the capacitance of the second capacitor may be subtracted to determine a differential pressure.

This invention also features a capacitive sensor including a housing having a hermetically sealed cavity, a plate in the cavity, a conductive diaphragm forming a part of the cavity and spaced from the plate, and a conductive layer on the plate, the conductive diaphragm and conductive layer on the plate being the electrodes of a capacitor whose capacitance varies with the position of the diaphragm relative to the plate.

This invention also features a capacitive sensor including a housing having a hermetically sealed cavity, a conductive plate in the cavity, a diaphragm forming a part of the cavity and spaced from the conductive plate, and a conductive layer on the diaphragm, the conductive layer on the diaphragm and the conductive plate being the electrodes of a capacitor whose capacitance varies with the position of the diaphragm relative to the plate.

This invention further features a capacitive sensor including a housing having a hermetically sealed cavity, a conductive plate in the cavity, and a conductive diaphragm forming a part of the cavity and spaced from the conductive plate, the conductive diaphragm and the conductive plate being the electrodes of a capacitor whose capacitance varies with the position of the diaphragm relative to the plate.

This invention further features a capacitive sensor including a housing having a hermetically sealed cavity, a plate in the cavity, a diaphragm forming a part of the cavity and spaced from the plate, a first conductive layer on the diaphragm, and a second conductive layer on the plate, the first and second conductive layers being the electrodes of a capacitor whose capacitance varies with the position of the diaphragm relative to the plate in response to an external force.

This invention further features a capacitive sensor including a housing having a hermetically sealed cavity, a plurality of plates in the cavity, a diaphragm forming a part of the cavity and spaced from the plurality of plates, a first conductive layer on the diaphragm, and one or more second conductive layers on the plurality of plates, the first conductive layer and the one or more second conductive layers being the electrodes of one or more capacitors whose capacitance varies with the position of the diaphragm relative to one or more of the plates.

This invention also features a capacitive sensor including a housing having a hermetically sealed cavity, a plate in the cavity, a plurality of diaphragms forming a part of the cavity and spaced from the plate, one or more first conductive layers on the plurality of diaphragms, and one or more second conductive layers on the plate, the one or more first conductive layers and the second conductive layers being the electrodes of one or more capacitors whose capacitance varies with the position of the plurality of diaphragms relative to the plate.

This invention further features a capacitive sensor including a housing having a hermetically sealed cavity, a plurality of plates in the cavity, a plurality of diaphragms forming a part of the cavity and spaced from the plurality of plates, one or more first conductive layers on the plurality of diaphragms, and one or more second conductive layers on the plurality of plates, the one or more first conductive layers and the one or more second conductive layers being the electrodes of one or more capacitors whose capacitance varies with the position of the plurality of diaphragms relative to the plurality of plates.

This invention also features a capacitive pressure monitoring sensor system including a housing having a hermetically sealed cavity, an integrated circuit die in the cavity, a diaphragm forming a part of the cavity and spaced from the integrated circuit die, a first conductive layer on the diaphragm, a second conductive layer on the die, the first and second conductive layers being the electrodes of a capacitor whose capacitance varies with the position of the diaphragm relative to the die to determine a pressure, and a signal conditioning circuit on the die for converting the capacitance to electrical signals which represent the pressure.

In one embodiment, the die may include a device for wireless transfer of signals which represent the pressure. The system may be mounted within a vehicle tire for measuring pressure within the tire.

This invention also features a capacitive sensor including a housing having a hermetically sealed cavity, a plate in the cavity, a diaphragm forming a part of the cavity and spaced from the plate, a first conductive layer on the diaphragm, a second conductive layer on the plate, the first and second conductive layers being the electrodes of a capacitor whose capacitance varies with the position of the diaphragm relative to the plate, and a proof mass disposed on the diaphragm wherein a change of position of the diaphragm in response to an applied force may be magnified by the presence of the proof mass for increasing the sensitivity of the sensor.

In one embodiment, the applied force may be due to acceleration. The applied force may be a centrifugal force.

This invention also features a method for manufacturing a capacitive sensor, the method including providing a housing having a hermetically sealable cavity, forming a part of the enclosure of the cavity with a diaphragm spaced from a plate, forming a first conductive layer on the diaphragm, forming a second conductive layer on the plate, the first and second conductive layers being the electrodes of a capacitor whose capacitance varies with the position of the diaphragm relative to the plate, disposing the plate in the cavity, and hermetically sealing the cavity.

In one embodiment, the method may further include the step of disposing a proof mass on the diaphragm.

This invention further features a method for measuring an external force, the method including exposing a force to be measured to a diaphragm having a first conductive layer spaced from a plate in a hermetically sealed cavity having a second conductive layer, and measuring a capacitance due to position of the first conductive layer of the diaphragm relative to the second conductive layer on the plate which may be representative of the force applied to the diaphragm.

In one embodiment, the force may include pressure. The force may include acceleration.

BRIEF DESCRIPTION OF THE DRAWINGS

Other objects, features and advantages will occur to those skilled in the art from the following description of a preferred embodiment and the accompanying drawings, in which:

FIGS. 3A-3D are schematic top views showing various embodiments of the conductive layers shown in FIG. 2;

PREFERRED EMBODIMENT

Figure 1:
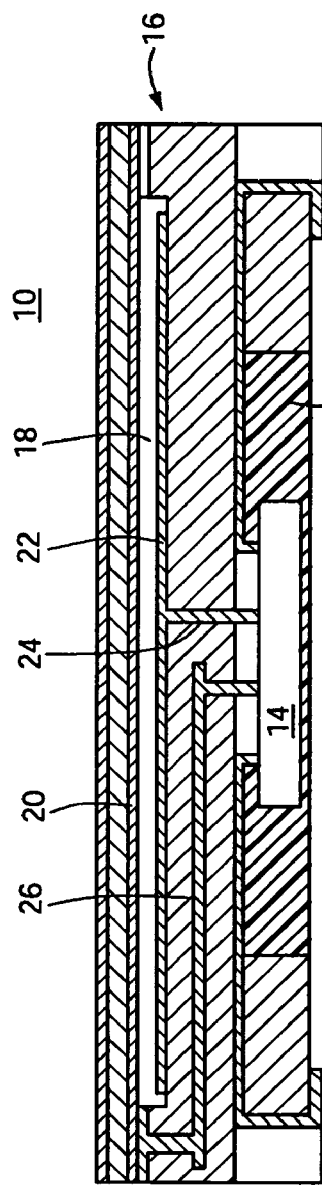
FIG. 1 is a schematic side view of a prior art pressure sensor employing a hermetically sealed cavity for the pressure sensor and another separate cavity for the electronic circuitry.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

As discussed in the Background section above, conventional capacitive-type pressure sensors, such as conventional capacitive pressure sensor 10, FIG. 1, as disclosed in Japanese Patent Application No. 2002039893 cited supra, overcomes the problem associated with contaminants affecting the capacitive electrodes with hermetically sealed cavity 18. Hermetically sealed cavity 18 includes capacitive electrode plates 20 and 22 which form a capacitive measuring device within sealed cavity 18. Capacitive pressure sensor 10 also includes cavity 12 which accommodates die 14. Sensor 10 also incorporates connection leads 24 and 26 for interconnecting capacitive electrode plates 22 and 20 to die 14. The result is a complex design which is difficult and expensive to manufacture.

Figure 2:
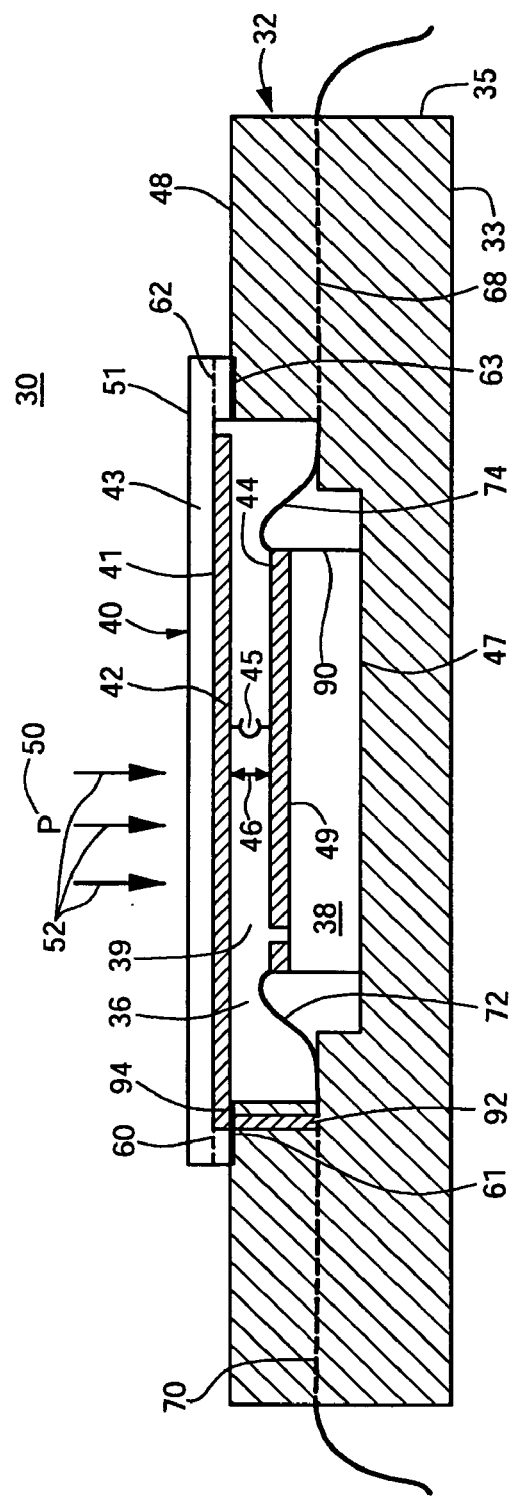
FIG. 2 is a schematic side view of one embodiment of the capacitive sensor of this invention.

In contrast, capacitive sensor 30, FIG. 2 of this invention includes housing 32 which includes hermetically sealed cavity 36. Plate 38 is disposed within hermetically sealed cavity 36. Plate 38 may contain an electrical sub-system as described in detail below or may be an integrated circuit die or a printed circuit board or similar device as known by those skilled in the art. Diaphragm 40 forms a part of cavity 36 and is spaced from plate 38. Diaphragm 40 includes conductive layer 42 and plate 38 includes conductive layer 44 together which form the electrodes of capacitor 45 whose capacitance varies with a change in position of diaphragm 40 relative to plate 38, as indicated by arrow 46. Changes to the position of diaphragm 40 with conductive layer 42 thereon relative to plate 38 with conductive layer 44 may occur, in one example, from external pressure P, indicated at 50, and shown by arrows 52, which deflects diaphragm 40 toward plate 38 and changes the capacitance of capacitor 45.

Utilizing conductive layer 44 on plate 38 and conductive layer 42 on diaphragm 40 within hermetically sealed cavity 36 to form the electrodes of capacitor 45 eliminates the need for a separate hermetically sealed cavity for the pressure sensor and another separate cavity to accommodate an integrated circuit die as found in the prior art. The result is a robust capacitive sensor which can be used in a wide variety of pressure sensor applications, e.g., a tire pressure monitoring system, an altimeter, an industrial process pressure sensor, an engine management system sensor and the like, which is simple in design and easy to manufacture. Capacitive sensor 30 utilizes less power than piezo-resistive designs discussed above in the Background section and is more suitable for battery powered applications. Moreover, capacitive sensor 30 is resilient to hostile environments.

Housing 32 may include ceramic, metal, plastic or similar materials known to those skilled in the art. Conductive layer 42 may be disposed on bottom surface 41 of diaphragm 40, disposed within diaphragm 40, as indicated at 43, or disposed on top surface 51 of diaphragm 40. In one design, diaphragm 40 is disposed proximate top surface 48 of housing 32 as discussed below. Diaphragm 40 could also be disposed proximate bottom surface 33 or side surface 35 of housing 32. Conductive layer 44 may be disposed on top surface 49 of plate 38, or, in other designs, conductive layer 44 may be disposed on bottom surface 47 or side surface 90 of plate 38, or embedded in plate 38. Conductive layers 42 and 44 typically include a conductive material, e.g., a metal alloy or similar material.

Diaphragm 40 may also be configured as a separately attached lid, as indicated by dashed lines 60 and 62, and is attached to housing 32 by soldering the lid to metal contacts 61 and 63 within housing 32. In other designs, a weld may be utilized to attach the lid to housing 32. Alternatively an adhesive material or glass may also be employed to attach the lid to housing 32. Diaphragm 40 may similarly include ceramic, metal, plastic or similar materials known to those skilled in the art and may be composed of a material different than housing 32.

Diaphragm 40 may also be composed of a conductive material instead of having a conductive layer 42 disposed thereon. In this example, conductive diaphragm 40 and conductive layer 44 on plate 38 form the electrodes of capacitor 45.

First conductive layer 42 and second conductive layer 44 are typically disposed on a substantial portion of the surface of diaphragm 40 plate 38, as shown by portion 53, FIG. 3A. Conductive layers 42 and 44 may be disposed on a subportion of diaphragm 40 and plate 38 as shown by portion 55, FIG. 3B. Conductive layers 42 and 44 may include a mesh of conductive material, as shown by mesh 57 of conductive material, FIG. 3C, to form the electrodes. Conductive layers 42 and 44 may include a solid layer 75 of conductive material, FIG. 3D, which may or may not include spaced orifices, e.g., orifices 65, 67, 69, and 71 that may have various shapes.

Electrical interconnection 68, FIG. 2, e.g., an electrical lead, may be connected to conductive layer 44 with electrical interconnection 74 for providing connection to external devices. A conductive path to conductive layer 42 can be provided with electrical interconnection 92 and additional electrical interconnection (e.g., conductive material) 93 to enable electrical connection from layer 44 to either plate 38 via electrical interconnection 72 or to external devices with electrical interconnection 70.

Figure 4:
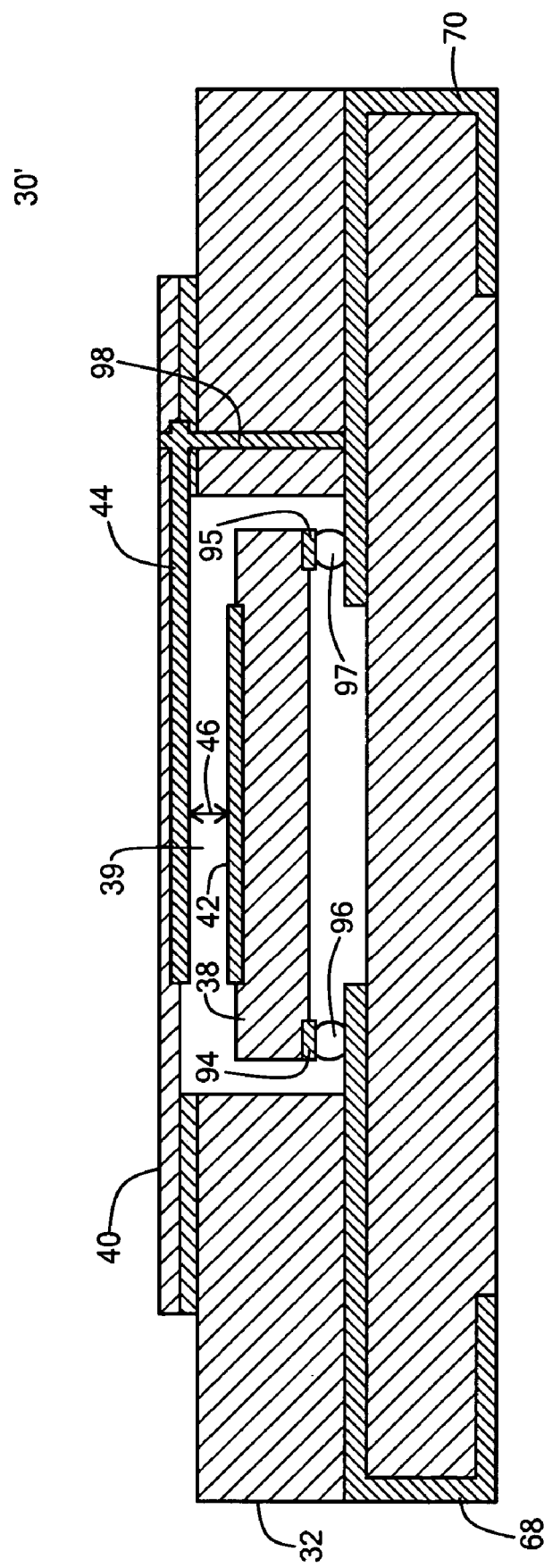
FIG. 4 is a schematic side view of another embodiment of the capacitive sensor of this invention.

Because the sensitivity of capacitive sensor 30 is inversely proportional to gap distance 39 between conductive layer 42 on diaphragm 40 and conductive layer 44 on plate 38, reducing gap distance 39 improves the sensitivity of sensor 30. One disadvantage of using electrical interconnections 72 and 74 to connect to plate 38 is that the height of electrical interconnections 72 and 74 places a lower limit on gap distance 39. Capacitive sensor 30', FIG. 4, where like parts have been given like numbers, of this invention shows an alternative design for connecting plate 38 to electrical interconnection 68 and 70. In this embodiment, electrical interconnections 68 and 70 extend under plate 38 and are joined to metal pads 94 and 95 on plate 38 by bonds 96 and 97 (e.g., solder or similar material bonds) to provide an electrical connection between leads 68 and 70 to plate 38. A conductive path is thus provided from conductive layer 44 on diaphragm 40 to metal pad 95 on plate 38 by electrical interconnection 98. By eliminating electrical interconnections 72 and 74, as shown in FIG. 2, gap distance 39, FIG. 4 is significantly decreased and is limited only as necessary to avoid electrical contact between conductive layers 42 and 44. If conductive layer 42 and conductive layer 44 include an insulating coating (not shown), diaphragm 40 may contact plate 38 under certain operating conditions.

Figure 5:
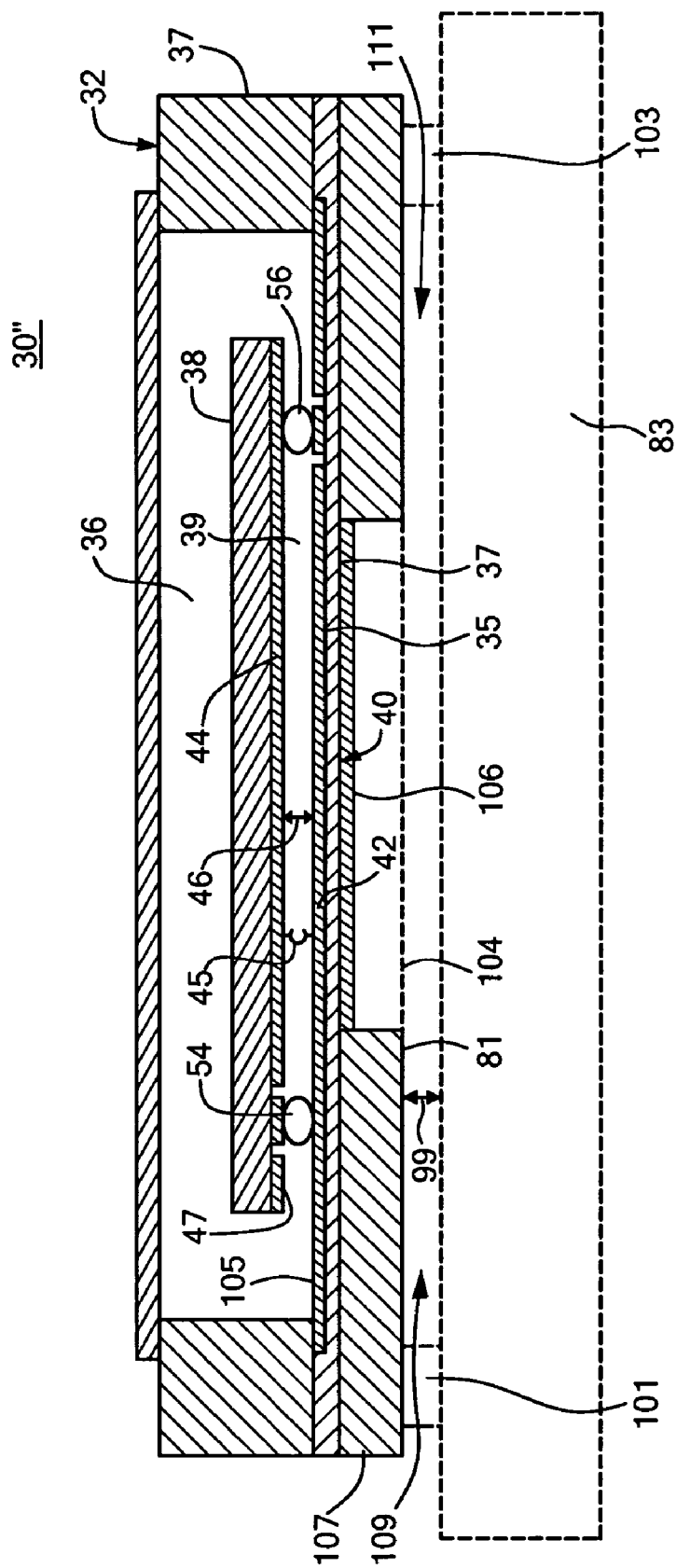
FIG. 5 is a schematic side view of yet another embodiment of the capacitive sensor of this invention showing an example of the diaphragm disposed on a bottom surface of the housing.

Capacitive sensor 30", FIG. 5, where like parts have been given like numbers, of this invention includes housing 32 including hermetically sealed cavity 36, as described above. Plate 38 is disposed within sealed cavity 36. In this embodiment, conductive layer 44 is disposed on bottom surface 47 of plate 38. Diaphragm 40 forms part of hermetically sealed cavity 36 and is spaced from plate 38. In this design, diaphragm 40 is disposed proximate to inner or bottom surface 105 of base 107 of housing 32 and includes conductive layer 42 disposed on a top surface 35 of diaphragm 40. Diaphragm 40 could also be disposed proximate to outer surface 81 of base 107 of housing 32 as shown by dashed line 104. Conductive layers may also be disposed on both top surface 35 and bottom surface 37 of diaphragm 40. For example, conductive layer 106 may be on bottom surface 37 of diagram 40 and conductive layer 42 may be on top surface 35 of diaphragm 40. Utilizing two conductive layers 42 and 106 on both top surface 35 and bottom surface 37 of diaphragm 40 results in a symmetric structure which minimizes stress in diaphragm 40. Conductive layer 106 may be electrically connected to a fixed voltage (not shown) to function as an electrical shield which may protect conductive layer 42 on diaphragm 40 and conductive layer 44 on plate 38 from unwanted electrical signals. Plate 38 may be soldered to housing 32, as indicated at 54 and 56. Similar as described above, conductive layers 42 and 44 form the electrodes of capacitor 45 whose capacitance varies with changes in position of diaphragm 40 relative to plate 38, as indicated by arrow 46. Housing 32 may also be attached to an additional substrate 83 (e.g., a printed wire board) by soldering or welding at the locations indicated at 101 and 103. Substrate 83 is typically spaced from housing 32, as indicated by gap distance 99 to allow air, gas, and/or fluid to flow proximate diaphragm 40, as shown by arrows 109 and 111.

Figure 6:
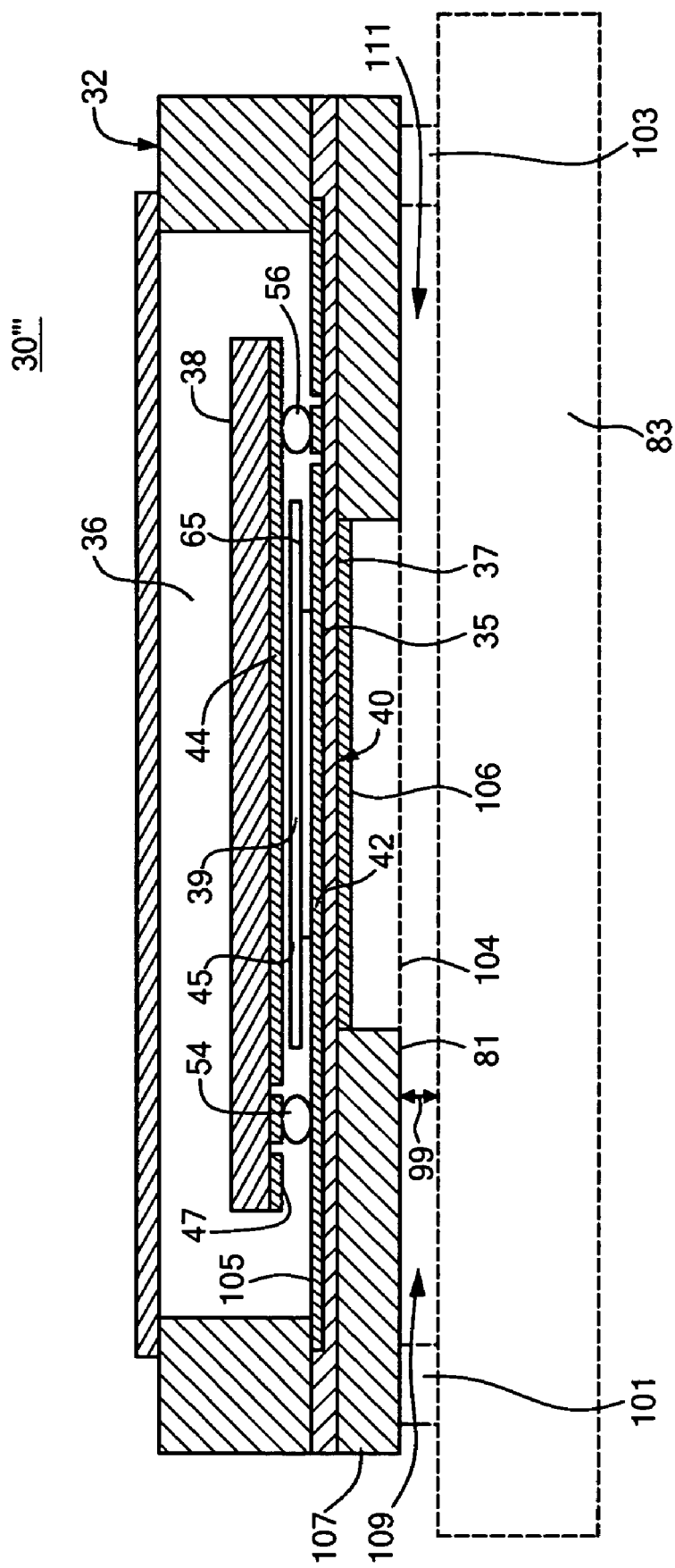
FIG. 6 is a schematic side view of the capacitive sensor shown in FIG. 5 employing a conductive spacer to reduce the gap distance between the conductive layer on the plate and the conductive layer on the diaphragm.

Capacitive sensor 30''', FIG. 6, where like parts have been given like numbers, may include conductive disc 65 which reduces the gap distance 39 between conductive layer 44 on plate 38 and conductive layer 42 on diaphragm 40. Reducing gap distance 39 improves the sensitivity of system 30''' while having only a minimal effect on the stiffness of diaphragm 40.

The capacitive sensor of this invention may include a plurality of plates disposed in the cavity having one or more conductive layers being the electrodes of one or more capacitors. In other designs, a plurality of diaphragms may form part of the cavity and may include one or more conductive layers which define one or more capacitors. In other examples, both a plurality of plates having one or more conductive layers and a plurality of diaphragms having one or more conductive layers may form the electrodes of one or more capacitors. Various examples of these embodiments are discussed below.

Figure 7:
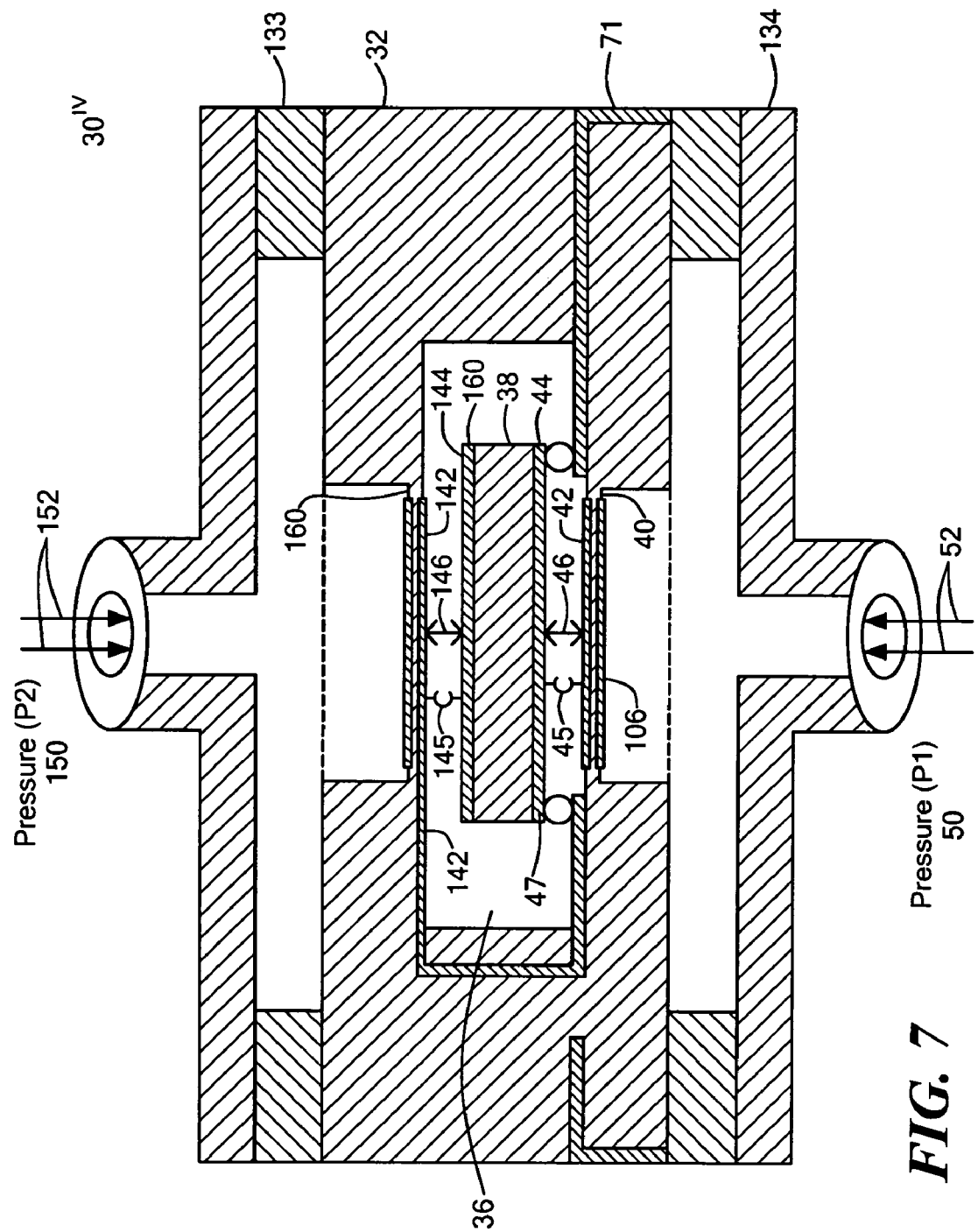
FIG. 7 is a schematic side view of another embodiment of the capacitive sensor of this invention employing two diaphragms each having conductive layers and a plate having two conductive layers for measuring a pressure differential.

Capacitive sensor $30^{IV}$, FIG. 7, where like parts have been given like numbers, of this invention includes two diaphragms which provide for the measurement of two physical effects, e.g., measuring two different pressures at the same time. Capacitive sensor $30^{IV}$ includes diaphragm 40 with conductive layer 42 (and optional conductive layer 106) as described above that responds to first pressure 50 ($P_1$), shown by arrows 52, causing a change in capacitance 45 between conductive layer 42 on diaphragm 40 and conductive layer 44 on plate 38. Capacitive sensor $30^{IV}$ also includes second diaphragm 140 having conductive layer 142 thereon which forms part of cavity 36. An additional conductive layer 144 is disposed on top surface 160 of plate 38. Similarly, conductive layer 142 of diaphragm 140 and conductive layer 144 on top surface 160 of plate 38 form a second capacitor 145 whose capacitance varies with changes in position of diaphragm 140, as shown by arrow 146, e.g., a deflection of diaphragm 140 in response to pressure 150 ($P_2$), shown as arrows 152. Housing 132 may also include access components 133 and 134 to facilitate application of pressures 50 ($P_1$) and 150 ($P_2$). Capacitive sensor $30^{IV}$ provides for the measurement of two independent pressures, e.g., pressure 50 ($P_1$) and pressure 150 ($P_2$) which provides for computation of the differential pressure between pressure 50 ($P_1$) and pressure 150 ($P_2$) which is useful in flow measurement in HVAC systems, in automotive mass air flow sensors, and the like.

Figure 8:
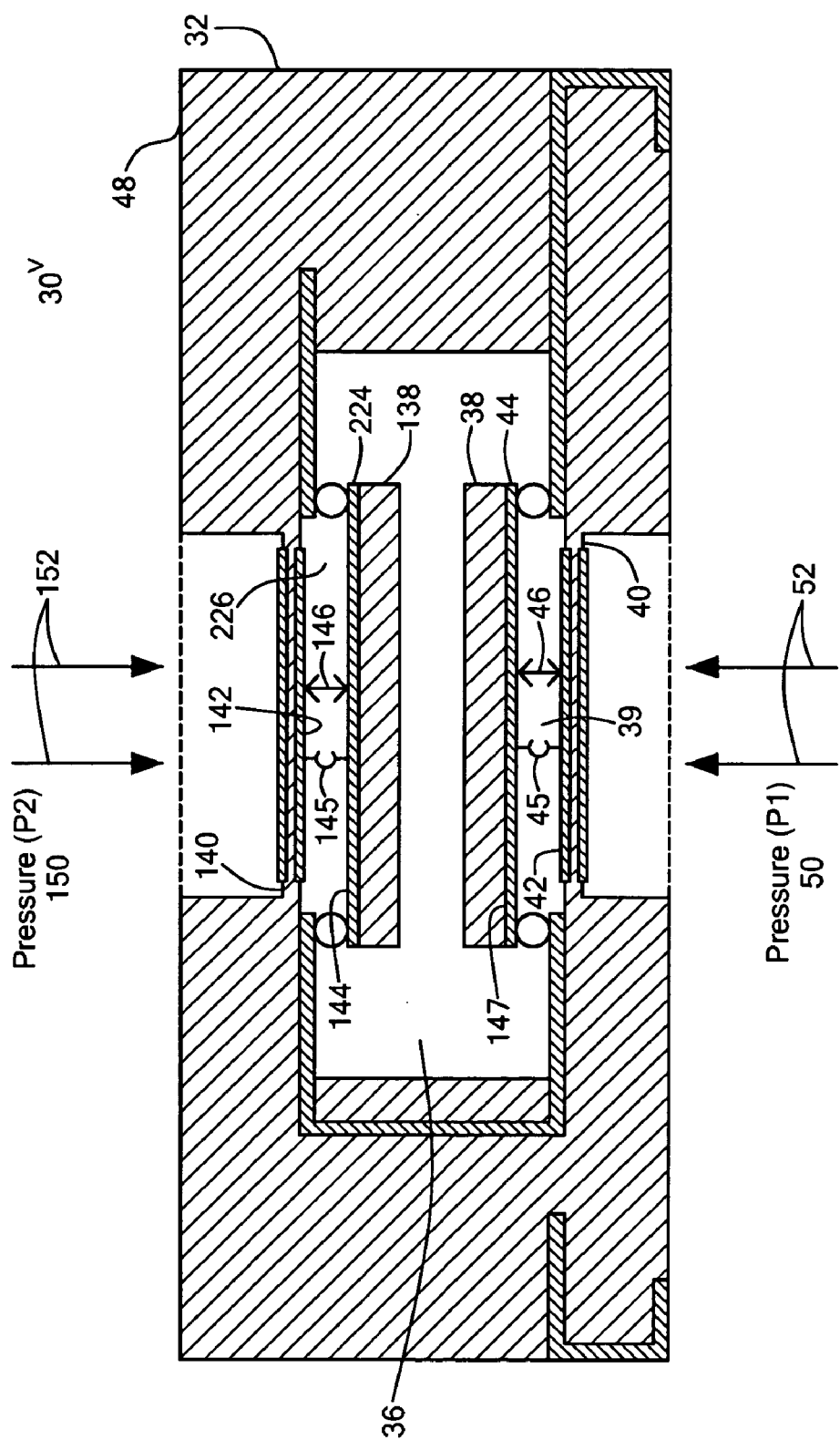
FIG. 8 is a schematic side view of another embodiment of the capacitive sensor of this invention employing two diaphragms each having conductive layers and two plates each having conductive layers for measuring a pressure differential.

Capacitive sensor $30^V$, FIG. 8, where like parts have been given like numbers, of this invention includes two diaphragms 40 and 140 and two plates 38 and 138. In this design, conductive layer 42 is on diaphragm 40 which is located proximate lower surface 33 of housing 32 and conductive layer 142 is on diaphragm 140 which is located proximate top surface 48 of housing 32. Conductive layer 44 is disposed proximate bottom surface 147 of plate 38 and conductive layer 144 is disposed proximate top surface 224 of plate 138. Conductive layer 144 on plate 138 and conductive layer 142 on diaphragm 140 form the electrodes of capacitor 145 whose capacitance varies with changes in position of diaphragm 140 relative to plate 138. As discussed above, capacitor 45 is formed by conductive layer 42 on diaphragm 40 and conductive layer 44 on bottom surface 147 of plate 38. Having two plates 38 and 138 and two diaphragms 40 and 140 which each form independent capacitors 45 and 145 allows for independent variation of the gap distances 39 and 226 of capacitors 45 and 145 which provides independent control of the sensitivities of each capacitor 45 and 145.

Figure 9:
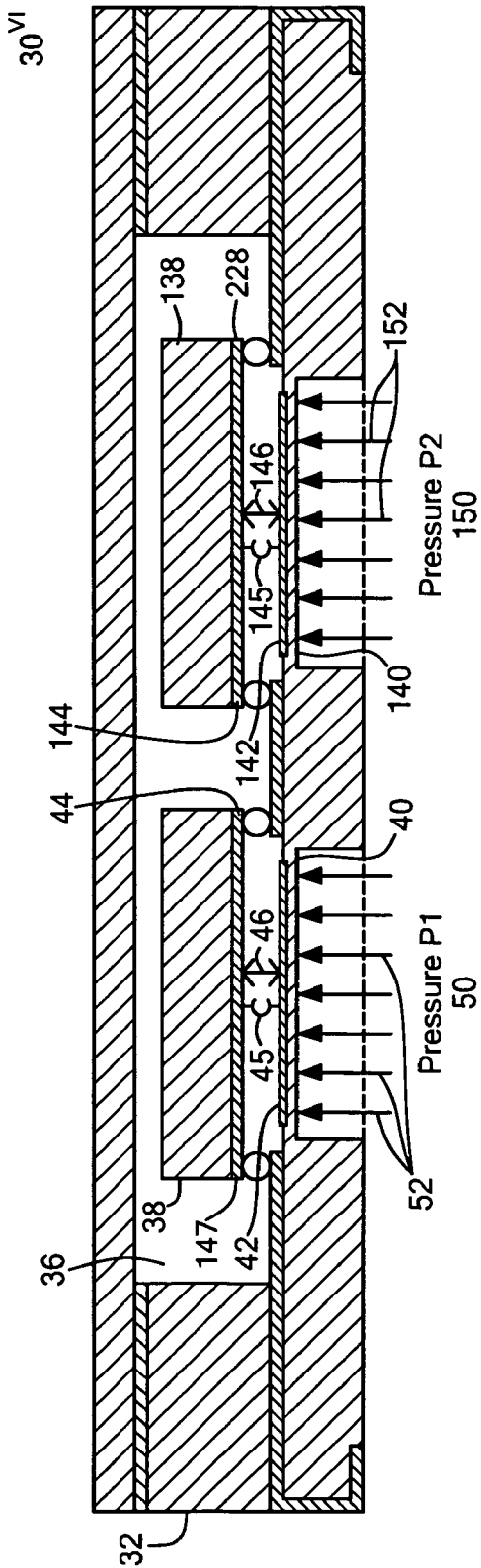
FIG. 9 is a schematic side view of other embodiments of the capacitive sensor shown in FIG. 8.

Capacitive sensor $30^{VI}$, FIG. 9, where like parts have been given like numbers, shows another embodiment of capacitive sensor $30^V$, FIG. 8 which includes two diaphragms 40 and 140 having conductive layers 42 and 142, respectively, and two plates 38 and 138 having conductive layers 44 and 144 disposed on bottom surfaces 147 and 228, respectively which are laterally spaced for allowing easier mounting of plates 38 and 138 in some applications.

Figure 10:
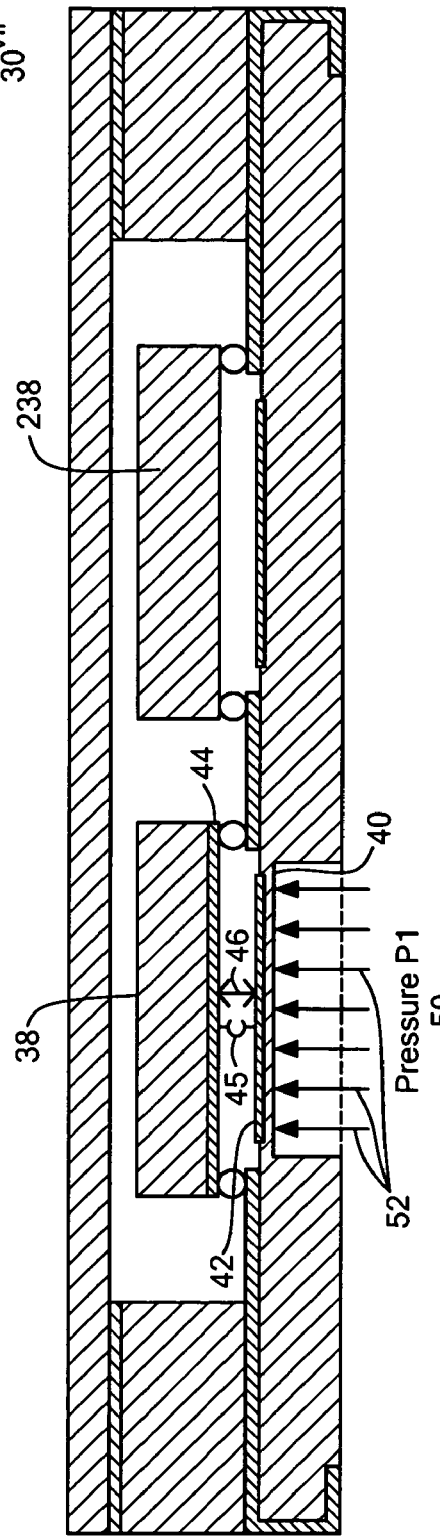
FIG. 10 is a schematic side view of another embodiment of the capacitive sensor shown in FIG. 5 having a second plate disposed in the cavity which includes an electrical sub-system.
Figure 11:
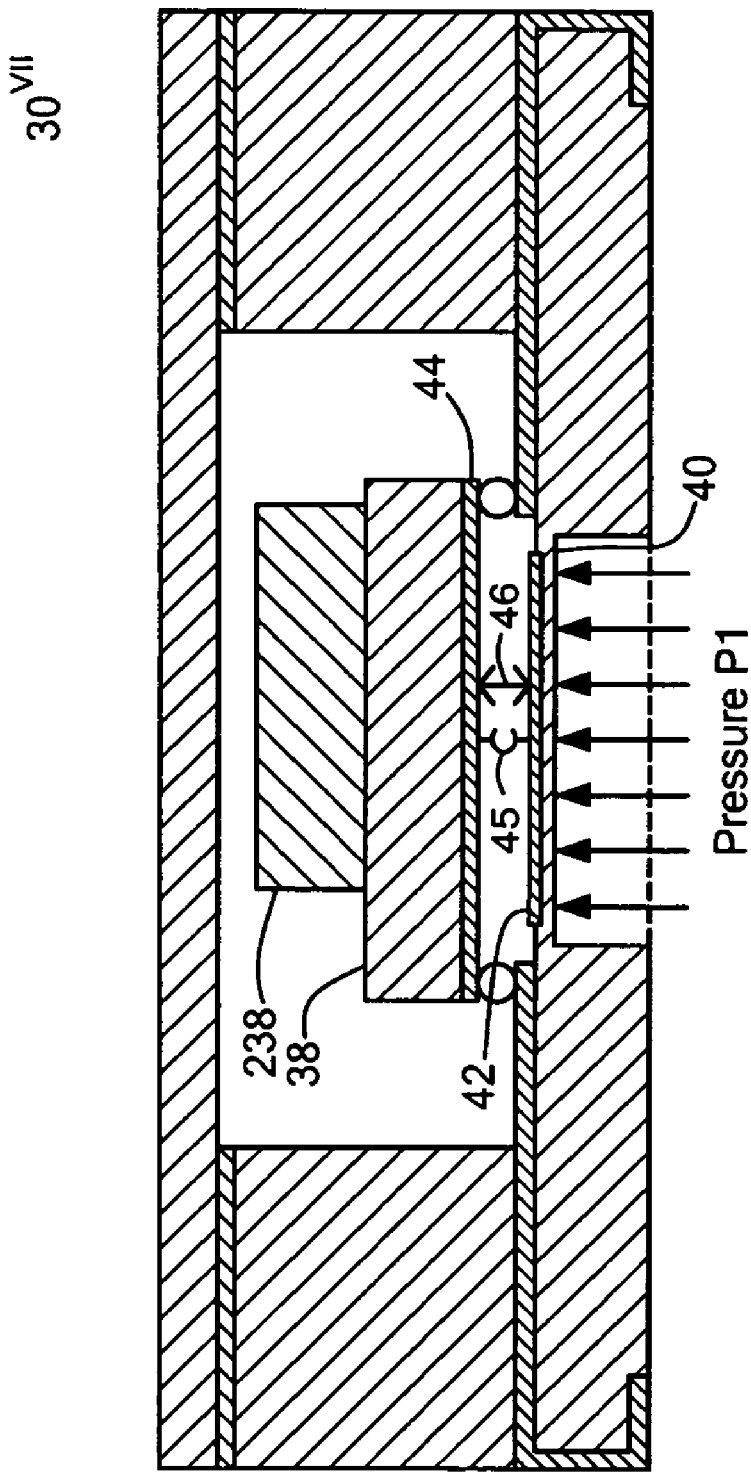
FIG. 11 is a schematic side view of another embodiment of the capacitive sensor shown in FIG. 10 showing an example of the second plate stacked on the first plate.

Capacitive sensor $30^{VII}$, FIG. 10, where like parts have been given like numbers, of this invention includes a single diaphragm 40 having conductive layer 42 and two plates 38 and 238. In this example plate 38 includes conductive layer 42 and forms capacitor 45 with conductive layer 44. Plate 238 is packaged in housing 32 and may contain an electrical sub-system to process the capacitance signal from capacitor 45 (discussed below). Plate 238 may also include other sensors, such as a temperature sensor or accelerometer. Plate 238 may be laterally spaced from plate 38 as shown in FIG. 10, or in a stacked configuration with plate 238 disposed above plate 38, as shown in FIG. 11, or with plate 238 disposed below plate 38 (not shown), or in any other configuration as known by those skilled in the art.

Plate 38 and/or plate 138 as described above in reference to FIG. 2 and FIGS. 4-11 may include any material that would accommodate conductive layer 44 to form capacitor 45 in conjunction with conductive layer 42 or conductive layer 144 to form capacitor 145 in conjunction with layer 142. Such materials may include silicon, ceramic, glass, quartz, plastic and metals. In one design, diaphragm 40 and/or diaphragm 140 may be comprised substantially of metal and functions as a conductive layer without the need for an explicit conductive layer such as conductive layer 42 and/or conductive layer 142. Plate 38 and/or plate 138 may be comprised substantially of metal and functions as a conductive layer without the need for an explicit conductive layer such as conductive layer 44 and/or conductive layer 144. Plate 38 and/or plate 138 may also be a printed circuit board as commonly used in the electronics industry and may include copper and epoxy resin or ceramic. Plate 38 and/or plate 138 may also be an integrated circuit die. Plate 38 and/or plate 138 may contain electrical sub-system, e.g., electric circuits and/or electronic components.

Figure 12:
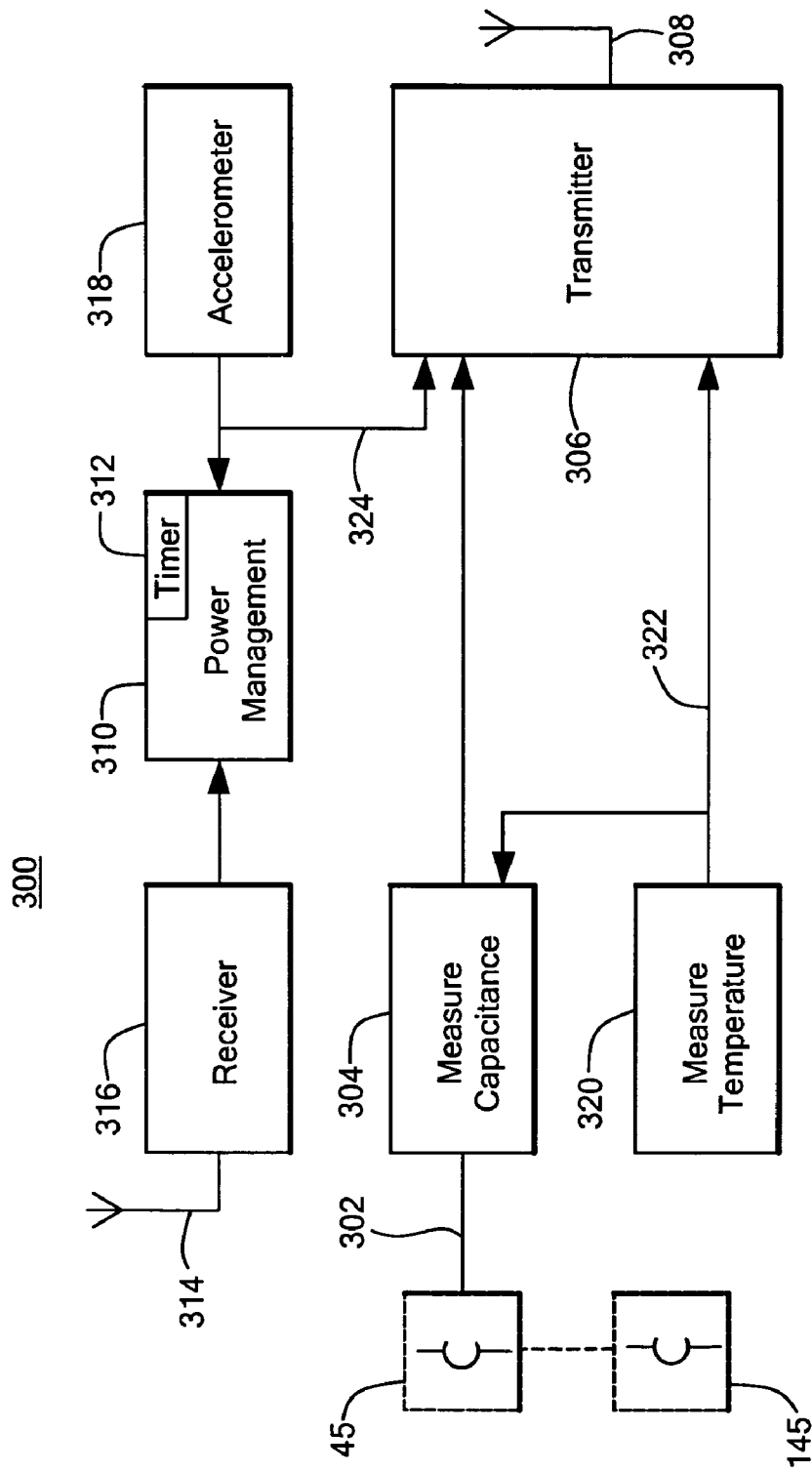
FIG. 12 is a schematic block diagram showing an example of the various functions of an electrical sub-system which may be included on one or more of the plates of the capacitive sensor of this invention.

For example, plate 38 and/or plate 138 as shown in FIGS. 2 and FIGS. 4-11 above may include electrical sub-system 300, FIG. 12, that may provide an interface for capacitive sensor 30 to transmit the measured pressure data to enable remote monitoring, such as for a tire pressure monitoring application. Electrical sub-system 300 may convert the capacitance signal on line 302 generated by capacitor 45 and/or 145 of capacitive sensor 30, FIG. 2, and FIGS. 4-11 above to electrical signals and provide a measurement of the capacitance, as shown by block 304, FIG. 12. Electrical sub-system 300 may transmit the measured capacitance, e.g., with transmitter 306 to a remote location by RF means via antenna 308, which may be internal or external to capacitive sensor 30. Electrical sub-system 300 may perform power management functions, as denoted by block 310, to activate and deactivate the various components of electrical sub-system 300 to minimize power dissipation and to maximize battery life in battery-powered applications. The power management may be self-controlling via internal timer 312 or respond to initiation signals from accelerometer 318 used for detecting motion or from initiation signals received via wireless link via antenna 314 and receiver 316. Antenna 314 could be a shared function with antenna 308, and receiver 316 could be combined with transmitter 306 as a transceiver circuit. Electrical sub-system 300 may also measure temperature, as indicated by block 320, with a device such as a silicon temperature sensor. The temperature signal on line 322 is indicative of temperature proximate to electrical sub-system 300 and may be transmitted to a remote location using the transmission techniques described above with antenna 308 or could be used by electrical sub-system 300 to correct for temperature variations of the capacitive sensor of this invention described above. The signal on line 324, indicative of acceleration, could also be transmitted to a remote location as described above with antenna 308 and may be used in a tire pressure monitoring system to identify the transmitting wheel by correlating the acceleration information with speed information from the wheel speed sensors in the anti-lock braking system of a vehicle. The various functions performed by electrical sub-system 300, e.g., converting and measuring capacitance, transmission, power management, temperature measurement, and the like may be achieved by using electronic and/or electrical circuitry as known by those skilled in the art.

Figure 13B:
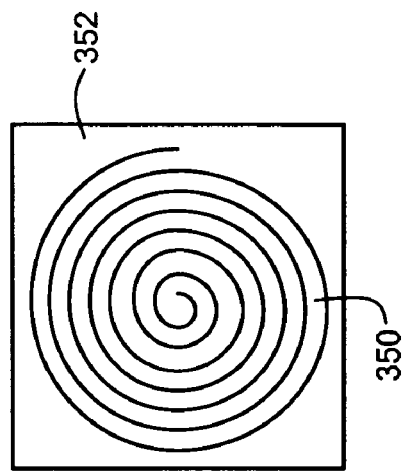
FIG. 13B is a schematic top view of the inductor shown in FIG. 13A.
Figure 13A:
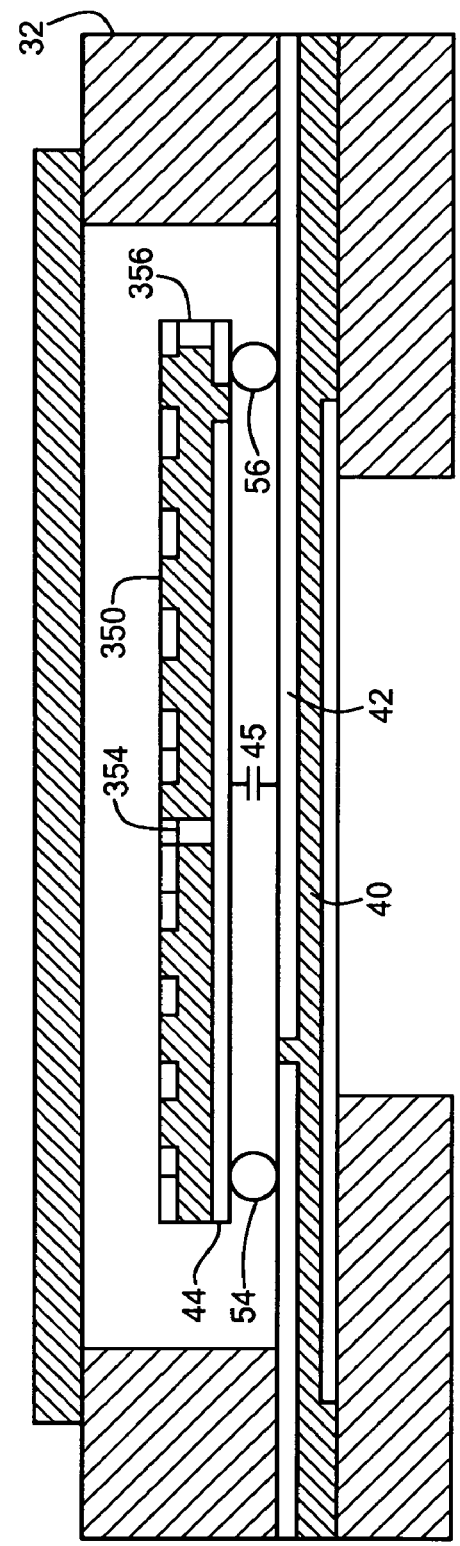
FIG. 13A is a schematic side view of another embodiment of the capacitive sensor of this invention employing an inductor to form a resonant circuit.

Capacitive sensor $30^{VIII}$, FIG. 13A, where like parts have been given like numbers of this invention includes inductor 350 disposed on plate 38. Inductor 350 may form coil 352, FIG. 13B. Inductor 350, FIG. 13A may also be disposed on housing 32 or any other suitable location within or on housing 32, plate 38 or diaphragm 40. Inductor 350 may be connected with conductive layer 44 via electrical interconnection 354 and conductive layer 42 via electrical interconnection 356 to form a resonant circuit with capacitor 45 such that the frequency of resonance is dependent on the deflection of diaphragm 40. The frequency of resonance can then be measured remotely by transmitting a tone from a remote transceiver (not shown). If the tone is at the resonant frequency the resonant circuit will continue to ring (but decaying) after the transmission of the tone has stopped. This ringing will cause capacitive sensor $30^{VIII}$ to retransmit the tone which can then be picked up by the remote transceiver. Alternatively, the remote circuit could be a transmitter only whose transmit frequency is varied and can monitor the transmission power of the transmitter. The transmit power will peak at a transmission frequency corresponding to the resonant frequency of capacitive sensor $30^{VIII}$, allowing detection of a signal representative of the capacitance 45 by interrogation of capacitive sensor $30^{VIII}$ without it actually transmitting any signal.

Figure 14:
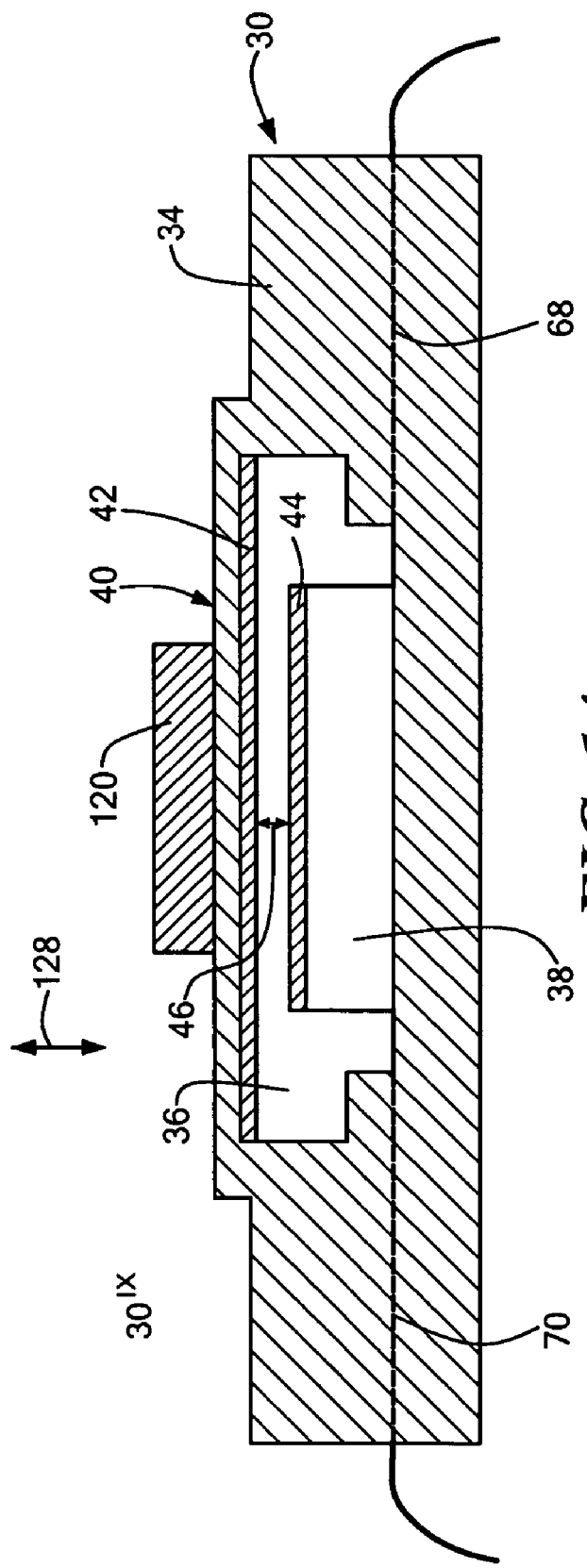
FIG. 14 is a schematic block diagram of the capacitive based sensor of this invention employed as an accelerometer.

Capacitive sensor $30^{IX}$, FIG. 14, where like parts have been given like numbers, of this invention includes proof mass 120 disposed on diaphragm 40 for inducing deflections in diaphragm 40 when capacitive sensor $30^{IX}$ is subjected to acceleration in the direction indicated by arrow 128. The acceleration on mass 120 changes the distance between first conductive layer 42 on diaphragm 40 and second conductive layer 44 on plate 38, as indicated by arrow 46 to measure a change in capacitance which is representative of a change in acceleration.

Figure 15:
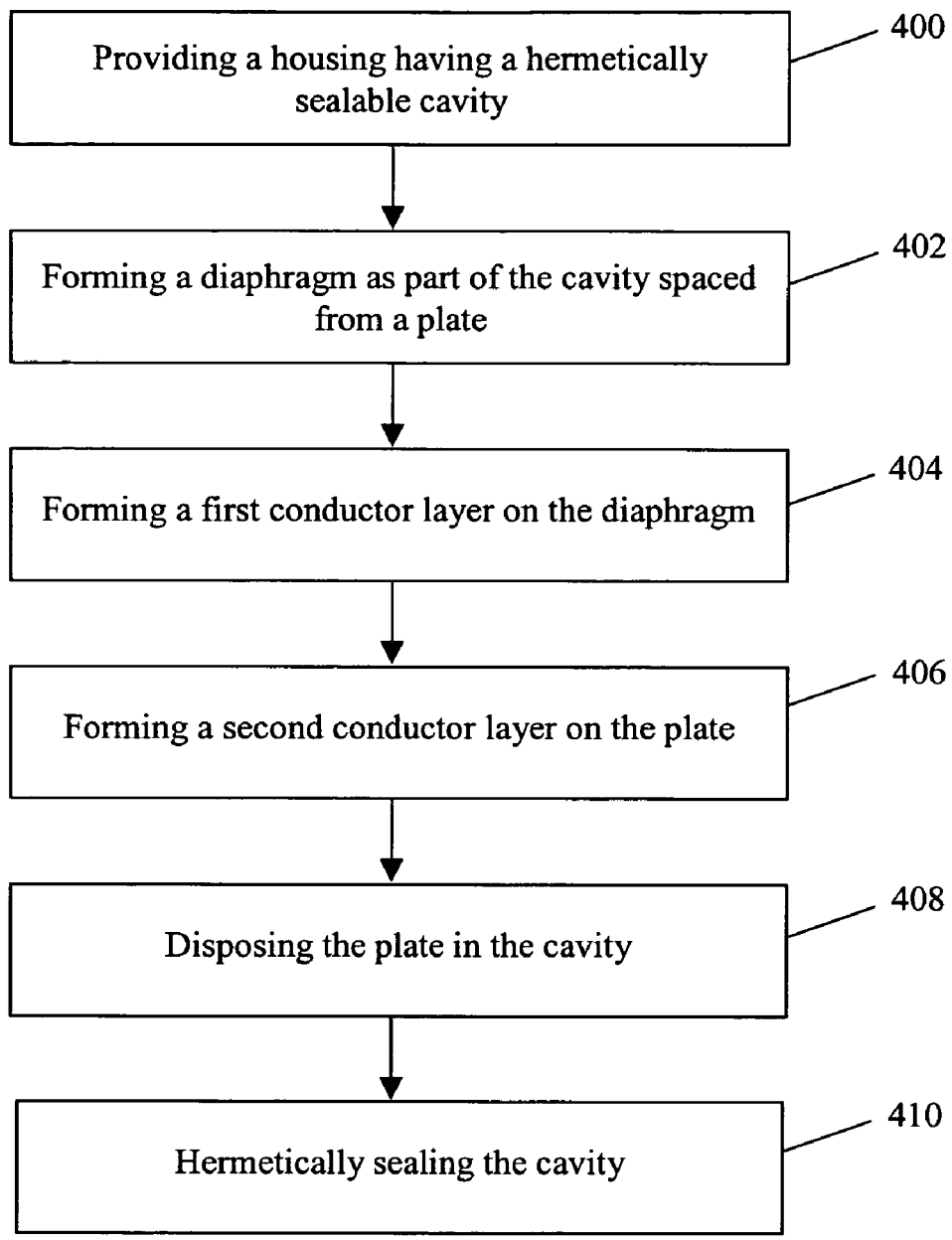
FIG. 15 is a block diagram showing an example of the method for manufacturing the capacitive sensor of this invention.

This invention also features a method for manufacturing a capacitive based sensor comprising the steps of: providing a housing having a hermetically sealable cavity, step 400, FIG. 15; forming a diaphragm as part of the cavity spaced from a plate, step 402. A first conductive layer is formed on the diaphragm, step 404. A second conductive layer is formed on the plate, step 406, and the plate is disposed in the cavity, step 408. The cavity is then hermetically sealed, step 410. The first and second conductive layers form the electrodes of a capacitor whose capacitance varies with the position change of the diaphragm relative to the plate. Although, as shown in FIG. 15, steps 400-410 are performed in the order shown, this is not a necessary limitation of this invention, as the steps may be performed in any order as known by those skilled in the art.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A capacitive sensor comprising:
   a housing having a hermetically sealed cavity;
   a first plate protruding within said cavity;
   a first diaphragm forming a part of said cavity and spaced from said first plate;
   a first conductive layer on said first diaphragm; and
   a second conductive layer on said first plate, said first and second conductive layers being the electrodes of a capacitor whose capacitance varies with the position of said first diaphragm relative to said first plate.

2. The capacitive sensor of claim 1 in which said first diaphragm is disposed proximate a top surface of said housing.

3. The capacitive sensor of claim 1 in which said first diaphragm is disposed proximate a bottom surface of said housing.

4. The capacitive sensor of claim 1 in which said first diaphragm is disposed proximate a side surface of said housing.

5. The capacitive sensor of claim 1 in which said second conductive layer is disposed proximate a top surface of said first plate.

6. The capacitive sensor of claim 1 in which said second conductive layer is disposed proximate a bottom surface of said first plate.

7. The capacitive sensor of claim 1 in which said second conductive layer is disposed proximate a side surface of said first plate.

8. The capacitive sensor of claim 1 in which said housing includes a material chosen from the group consisting of ceramic, plastic, metal or any combination thereof.

9. The capacitive sensor of claim 1 in which said first plate includes an integrated circuit die.

10. The capacitive sensor of claim 1 in which said first plate includes a printed circuit board.

11. The capacitive sensor of claim 1 in which said first conductive layer is embedded in said first diaphragm.

12. The capacitive sensor of claim 1 in which said second conductive layer is embedded in said first plate.

13. The capacitive sensor of claim 1 in which said first conductive layer is disposed on the outer surface of said first diaphragm.

14. The capacitive sensor of claim 1 in which said first conductive layer is disposed on the inner surface of said first diaphragm.

15. The capacitive sensor of claim 1 in which said first conductive layer is disposed on a portion of said first diaphragm.

16. The capacitive sensor of claim 1 in which said second conductive layer is disposed on a portion of said first plate.

17. The capacitive sensor of claim 1 in which said housing includes a separately attached lid.

18. The capacitive sensor of claim 1 in which said diaphragm is a separately attached lid.

19. The capacitive sensor of claim 18 in which said diaphragm includes a material chosen from the group consisting of: ceramic, plastic, metal, or any combination thereof.

20. The capacitive sensor of claim 1 in which said diaphragm is comprised of a material different than said housing.

21. The capacitive sensor of claim 18 in which said lid is attached to said housing by soldering said lid to a metal layer fused into said housing.

22. The capacitive sensor of claim 18 in which said lid is attached to said housing by welding said lid to a metal layer fused into said housing.

23. The capacitive sensor of claim 18 in which said lid is attached to said housing with an adhesive material.

24. The capacitive sensor of claim 18 in which said lid is attached to said housing with glass.

25. The capacitive sensor of claim 1 in which said first conductive layer includes a mesh of said conductive material for forming said electrode.

26. The capacitive sensor of claim 1 in which said first conductive layer includes a solid layer of conductive material for forming said electrode.

27. The capacitive sensor of claim 1 in which said first conductive layer includes a solid layer of conductive material with spaced orifices therein.

28. The capacitive sensor of claim 1 in which said second conductive layer includes a mesh of said conductive material for forming said electrode.

29. The capacitive sensor of claim 1 in which said second conductive layer includes a solid layer of conductive material for forming said electrode.

30. The capacitive sensor of claim 1 in which said second conductive layer includes a solid layer of conductive material with spaced orifices therein.

31. The capacitive sensor of claim 1 in which said first plate includes a material chosen from the group consisting of silicon, ceramic, glass, quartz, plastic, epoxy resin and metal.

32. The capacitive sensor of claim 1 in which said first plate includes an electrical sub-system.

33. The capacitive sensor of claim 32 in which said electrical sub-system converts said capacitance to one or more electrical signals.

34. The capacitive sensor of claim 32 in which said electrical sub-system measures said capacitance.

35. The capacitive sensor of claim 32 in which said electrical sub-system includes a transmitter for transmitting said one or more signals representative of said capacitance.

36. The capacitive sensor of claim 35 further including an antenna responsive to said one or more signals.

37. The capacitive sensor of claim 32 further including a receiver for receiving initiation signals.

38. The capacitive sensor of claim 32 in which said electrical sub-system measures the temperature proximate said sub-system.

39. The capacitive sensor of claim 38 in which said electrical sub-system transmits one or more signals representative of said temperature.

40. The capacitive sensor of claim 32 in which said electrical sub-system manages the power consumption of said electrical sub-system.

41. The capacitive sensor of claim 32 in which said electrical sub-system includes an interrogation device for allowing said sub-system to be externally interrogated.

42. The capacitive sensor of claim 32 in which said electrical sub-system receives external commands to manage the power consumption of said sub-system.

43. The capacitive sensor of claim 1 further including an inductor combined with said capacitor formed by said first and second conductive layers to form a resonant circuit.

44. The capacitive sensor of claim 1 in which said first plate includes one or more sensors.

45. The capacitive sensor of claim 44 in which said one or more sensors are chosen from the group consisting of: an acceleration sensor, a temperature sensor and a motion sensor.

46. The capacitive sensor of claim 45 in which said first plate further includes a transmission device for transmission of one or more output signals of said one or more sensors.

47. The capacitive sensor of claim 1 further including first electrical interconnections disposed in said housing.

48. The capacitive sensor of claim 47 further including second electrical interconnections for connecting said second conductive layer on said first plate to said first electrical interconnections.

49. The capacitive sensor of claim 48 further including third electrical interconnections for connecting said first conductive layer on said diaphragm to said first electrical interconnections.

50. The capacitive sensor of claim 1 in which said capacitance represents pressure.

51. The capacitive sensor of claim 1 in which said capacitance represents the difference in pressure between said cavity and the exterior to said housing.

52. The capacitive sensor of claim 1 further including a proof mass disposed on said diaphragm for varying the position of said diaphragm relative to said plate in response to acceleration.

53. The capacitive sensor of claim 1 in which said second conductive layer includes a conductive spacer for reducing the gap distance between said first conductive layer and said second conductive layer.

54. The capacitive sensor of claim 1 in which capacitance varies with said position of said diaphragm relative to said plate in response to an external force.

55. The capacitive sensor of claim 1 further including a second plate in said cavity.

56. The capacitive sensor of claim 55 in which said second plate includes an electrical sub-system.

57. The capacitive sensor of claim 56 in which said electrical sub-system converts said capacitance to one or more electrical signals.

58. The capacitive sensor of claim 56 in which said electrical sub-system measures said capacitance.

59. The capacitive sensor of claim 56 in which said electrical sub-system includes a transmitter for transmitting said one or more signals representative of said capacitance.

60. The capacitive sensor of claim 59 further including an antenna responsive to said one or more signals.

61. The capacitive sensor of claim 56 further including a receiver for receiving initiation signals.

62. The capacitive sensor of claim 56 in which said electrical sub-system measures the temperature proximate said sub-system.

63. The capacitive sensor of claim 62 in which said electrical sub-system transmits one or more signals representative of said temperature.

64. The capacitive sensor of claim 56 in which said electrical sub-system manages the power consumption of said electrical sub-system.

65. The capacitive sensor of claim 56 in which said electrical sub-system includes an interrogation device for allowing said sub-system to be externally interrogated.

66. The capacitive sensor of claim 56 in which said electrical sub-system receives external commands to manage the power consumption of said sub-system.

67. The capacitive sensor of claim 55 in which said second plate includes one or more sensors.

68. The capacitive sensor of claim 67 in which said one or more sensors are chosen from the group consisting of: an acceleration sensor, a temperature sensor and a motion sensor.

69. The capacitive sensor of claim 68 in which said first plate and/or said second plate further includes a transmission device for transmission of one or more output signals of said one or more sensors.

70. The capacitive sensor of claim 55 in which said second plate is disposed on a top surface of said first plate.

71. The capacitive sensor of claim 55 in which said second plate is laterally spaced from said first plate.

72. The capacitive sensor of claim 1 further including a second diaphragm forming said part of said cavity spaced from said first plate.

73. The capacitive sensor of claim 72 further including a third conductive layer on said second diaphragm.

74. The capacitive sensor of claim 73 further including a fourth conductive layer on said first plate, said third and fourth conductive layers being the electrodes of a second capacitor whose capacitance varies with the position of said second diaphragm relative to said first plate.

75. The capacitive sensor of claim 1 further including a second plate having a fourth conductive layer, and a second diaphragm having a third conductive layer forming part of said cavity spaced from said second plate.

76. The capacitive sensor of claim 75 in which said fourth conductive layer on said second plate and said third conductive layer on said second diaphragm form a second capacitor whose capacitance varies with the position of said second diaphragm relative to said second plate.

77. The capacitive sensor of claim 72 in which said first diaphragm is proximate on a top surface of said housing and said second diaphragm is proximate a bottom surface of said housing.

78. The capacitive sensor of claim 72 in which said first and second diaphragms are laterally spaced on said housing.

79. The capacitive sensor of claim 75 in which said first diaphragm and said first plate are proximate a top surface of said housing and said second diaphragm and said second plate are proximate a bottom surface of said housing.

80. The capacitive sensor of claim 75 in which said first plate and said first diaphragm and said second plate and said second diaphragm are laterally spaced in said housing.

81. The capacitive sensor of claim 74 in which each of said first and second diaphragms may be subjected to a different pressure such that the capacitance of said first capacitor represents a difference in pressure between said cavity and the pressure applied to said first diaphragm and the capacitance of said second capacitor represents a difference in pressure between said cavity and the pressure applied to said second diaphragm.

82. The capacitive sensor of claim 76 in which each of said diaphragms may be subjected to a different pressure such that the capacitance of said first capacitor represents a difference in pressure between said cavity and the pressure applied to said first diaphragm and the capacitance of said second capacitor represents a difference in pressure between said cavity and the pressure applied to said second diaphragm.

83. The capacitive sensor of claim 81 wherein said capacitance of said first capacitor and said capacitance of said second capacitor are subtracted to determine a differential pressure.

84. The capacitive sensor of claim 82 wherein said capacitance of said first capacitor and said capacitance of said second capacitor are subtracted to determine a differential pressure.

85. A capacitive sensor comprising:
   a housing having a hermetically sealed cavity;
   a plate protruding within said cavity;
   a conductive diaphragm forming a part of said cavity and spaced from said plate; and
   a conductive layer on said plate, said conductive diaphragm and conductive layer on said plate being the electrodes of a capacitor whose capacitance varies with the position of said conductive diaphragm relative to said plate.

86. A capacitive sensor comprising:
   a housing having a hermetically sealed cavity;
   a conductive plate protruding within said cavity;
   a diaphragm forming a part of said cavity and spaced from said conductive plate; and
   a conductive layer on said diaphragm, said conductive layer on said diaphragm and said conductive plate being the electrodes of a capacitor whose capacitance varies with the position of said diaphragm relative to said plate.

87. A capacitive sensor comprising:
   a housing having a hermetically sealed cavity;
   a conductive plate protruding within said cavity; and
   a conductive diaphragm forming a part of said cavity and spaced from said conductive plate; said conductive diaphragm and said conductive plate being the electrodes of a capacitor whose capacitance varies with the position of said diaphragm relative to said plate.

88. A capacitive sensor comprising:
   a housing having a hermetically sealed cavity;
   a plate protruding within said cavity;
   a diaphragm forming a part of said cavity and spaced from said plate;
   a first conductive layer on said diaphragm; and
   a second conductive layer on said plate, said first and second conductive layers being the electrodes of a capacitor whose capacitance varies with the position of said diaphragm relative to said plate in response to an external force.

\* \* \* \* \*